United States Patent
Otomaru et al.

(10) Patent No.: US 9,414,486 B2
(45) Date of Patent: Aug. 9, 2016

(54) WIRING BOARD, WIRING BOARD WITH LEAD, AND ELECTRONIC DEVICE

(71) Applicant: KYOCERA Corporation, Kyoto-shi, Kyoto (JP)

(72) Inventors: Hidekazu Otomaru, Kyoto (JP); Takashi Kimura, Kyoto (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 14/758,390

(22) PCT Filed: Jul. 28, 2014

(86) PCT No.: PCT/JP2014/069809
§ 371 (c)(1),
(2) Date: Jun. 29, 2015

(87) PCT Pub. No.: WO2015/016173
PCT Pub. Date: Feb. 5, 2015

(65) Prior Publication Data
US 2015/0334834 A1   Nov. 19, 2015

(30) Foreign Application Priority Data

Jul. 29, 2013  (JP) ................. 2013-156786
Sep. 20, 2013  (JP) ................. 2013-195509

(51) Int. Cl.
*H05K 1/09* (2006.01)
*H05K 1/11* (2006.01)
(Continued)

(52) U.S. Cl.
CPC ...... *H05K 1/09* (2013.01); *H01L 23/15* (2013.01); *H01L 23/498* (2013.01); *H01L 23/49811* (2013.01); *H01L 23/49866* (2013.01); *H05K 1/097* (2013.01); *H05K 1/111* (2013.01); *H05K 1/181* (2013.01); *H05K 3/4007* (2013.01); *H01L 23/49827* (2013.01); *H01L 2224/16225* (2013.01); *H05K 1/113* (2013.01); *H05K 3/34* (2013.01); *H05K 3/4015* (2013.01);
(Continued)

(58) Field of Classification Search
CPC ......... H05K 1/09; H05K 1/092; H05K 1/095; H05K 1/097
See application file for complete search history.

(56) References Cited

U.S. PATENT DOCUMENTS

2005/0056458 A1   3/2005   Sugiura

FOREIGN PATENT DOCUMENTS

JP   54-087657 A   7/1979
JP   04-075397 A   3/1992
(Continued)

OTHER PUBLICATIONS

International Search Report, PCT/JP2014/069809, Oct. 28, 2014, 2 pgs.

*Primary Examiner* — Jeremy C Norris
(74) *Attorney, Agent, or Firm* — Volpe and Koenig, P.C.

(57) ABSTRACT

A wiring board includes an insulating substrate composed of a ceramic sintered compact; and a connection pad disposed on a surface part of the insulating substrate. The connection pad includes a first portion disposed on the surface part of the insulating substrate and a second portion disposed on the first portion and an outer periphery of the second portion being located on an inner side of an outer periphery of the first portion. The second portion of the connection pad is composed of platinum, and at least an exposed surface part of the first portion of the connection pad is composed of platinum containing a ceramic component.

15 Claims, 6 Drawing Sheets

(51) Int. Cl.
*H01L 23/498* (2006.01)
*H05K 1/18* (2006.01)
*H01L 23/15* (2006.01)
*H05K 3/40* (2006.01)
*H05K 3/34* (2006.01)

(52) U.S. Cl.
CPC ............... *H05K2201/0376* (2013.01); *H05K 2201/09745* (2013.01); *H05K 2201/09827* (2013.01); *H05K 2201/10318* (2013.01); *H05K 2203/121* (2013.01)

(56) References Cited

FOREIGN PATENT DOCUMENTS

| | | |
|---|---|---|
| JP | 04-156554 A | 5/1992 |
| JP | 10-242628 A | 9/1998 |
| JP | 2007-232598 A | 9/2007 |
| JP | 2008-109144 A | 5/2008 |
| JP | 2009-224651 A | 10/2009 |
| JP | 2010-177482 A | 8/2010 |
| WO | 2005/004565 A1 | 1/2005 |

(a)

(b)

(a)

(b)

WIRING BOARD, WIRING BOARD WITH LEAD, AND ELECTRONIC DEVICE

TECHNICAL FIELD

The present invention relates to: a wiring board constructed such that a connection pad is provided on the surface of an insulating substrate composed of a ceramic sintered compact; and a wiring board with a lead terminal and an electronic device including this wiring board.

BACKGROUND ART

As a wiring board used for mounting or the like of electronic components such as sensor elements, semiconductor elements, capacitive elements, and piezoelectric vibrators, a wiring board is employed that includes: an insulating substrate composed of a ceramic sintered compact such as an aluminum-oxide based sintered compact; and a connection pad for external connection provided on a surface such as the upper face and the lower face of the insulating substrate. For example, the connection pad is composed of a metallic material such as tungsten, molybdenum, copper, and silver and are provided as a metallized layer by simultaneous firing of the insulating substrate.

For example, this wiring board is utilized such that electronic components are mounted on the insulating substrate so that an electronic device is constructed. Then, the electronic device is mounted on a variety of electronic equipment. In the wiring board, in some cases, a lead terminal serving as a terminal for external connection is joined to the connection pad by brazing or another means. This lead terminal is electrically connected to the electric circuit of an electronic equipment so that the electronic device is electrically connected to the electronic equipment.

CITATION LIST

Patent Literature

Patent Literature 1: Japanese Unexamined Patent Publication JP-A 4-156554 (1992)
Patent Literature 2: Japanese Unexamined Patent Publication JP-A 2007-232598

SUMMARY OF INVENTION

Technical Problem

In recent years, there is an increasing tendency that wiring boards or the like are used in the vicinity of internal combustion engines like in aviation, space, or automobile applications. Then, in some cases, such wiring boards or the like are used in a high-temperature environment of 400 to 500° C. Thus, improvement in the heat resisting property is increasingly required like suppression of oxidation in the connection pad caused by this heat and suppression of mechanical fracture in the connection pad or the like caused by a thermal stress resulting from a difference between thermal expansion coefficients of the insulating substrate and the connection pad.

Solution to Problem

A wiring board according to one aspect of the invention includes: an insulating substrate composed of a ceramic sintered compact; and a connection pad disposed on a surface part of the insulating substrate. Then, the connection pad includes: a first portion disposed on the surface part of the insulating substrate; and a second portion disposed on the first portion, an outer periphery of the second portion being located on an inner side of an outer periphery of the first portion. The second portion of the connection pad is composed of platinum, and at least an exposed surface part of the first portion of the connection pad is composed of platinum containing a ceramic component.

A wiring board with a lead terminal according to one aspect of the invention includes: a wiring board having the configuration mentioned above; and a lead terminal joined to the connection pad of the wiring board.

An electronic device according to one aspect of the invention includes: a wiring board having the configuration mentioned above; and an electronic component mounted on the insulating substrate of the wiring board and electrically connected to the connection pad.

Advantageous Effects of Invention

According to the wiring board of one aspect of the invention, the first and the second portion are, both, less prone to be oxidized even at high temperatures and hence oxidation in the connection pad or the like can be suppressed. Further, mechanical fracture in the connection pad or the like caused by a thermal stress resulting from a difference between thermal expansion coefficients of the insulating substrate and the connection pad is suppressed. Thus, a wiring board excellent in the heat resisting property can be provided.

According to the wiring board with a lead of one aspect of the invention, a lead terminal is joined to a wiring board having the configuration mentioned above and hence a wiring board with a lead excellent in the heat resisting property can be provided.

According to the electronic device of one aspect of the invention, an electronic component is mounted on a wiring board having the configuration mentioned above and hence an electronic device excellent in the heat resisting property can be provided.

DESCRIPTION OF EMBODIMENTS

A wiring board and a wiring board with a lead according to an embodiment of the invention are described below with reference to the accompanying drawings. Distinction of up and down in the following description is for convenience. That is, up and down at the time of actual use of the wiring board and the like are not limited to these.

Figure 1:
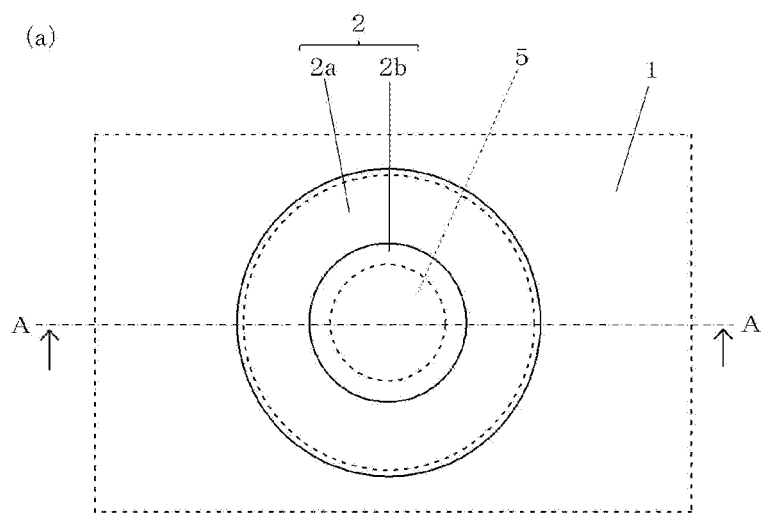
FIG. 1(a) is a plan view showing a main part of a wiring board according to an embodiment of the invention and FIG. 1(b) is a sectional view taken along the line A-A in FIG. 1(a)
Figure 1:
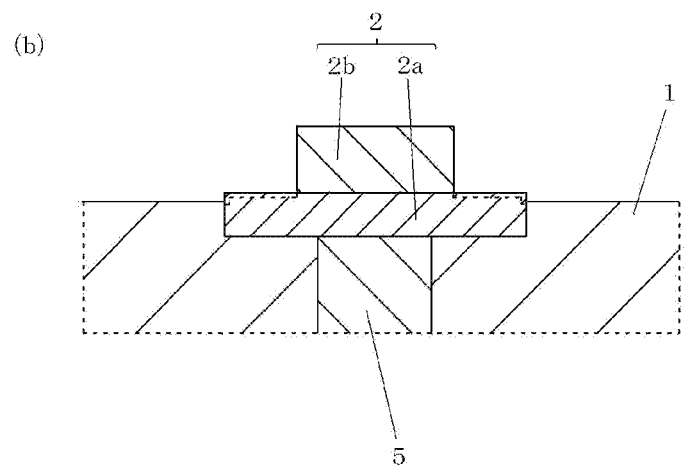
Figure 2:
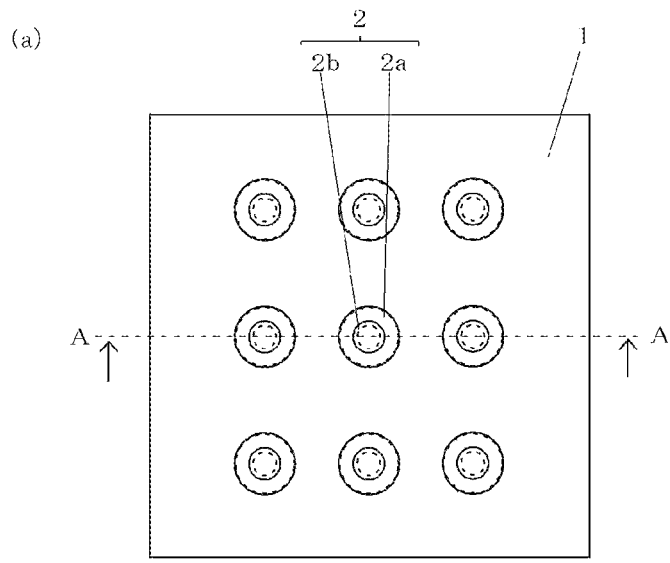
FIG. 2(a) is a plan view showing an example of the entirety of a wiring board whose main part is shown in FIG. 1
FIG. 2(b) is a sectional view taken along the line A-A in FIG. 2(a)
Figure 2:
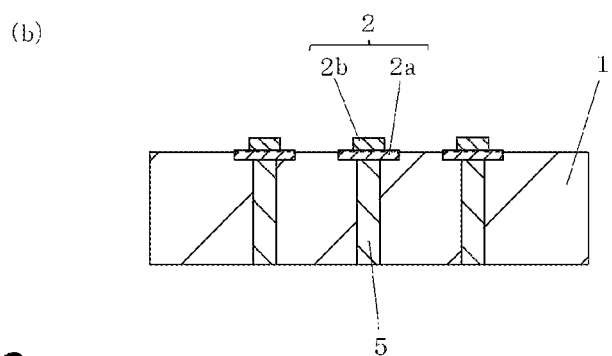
Figure 3:
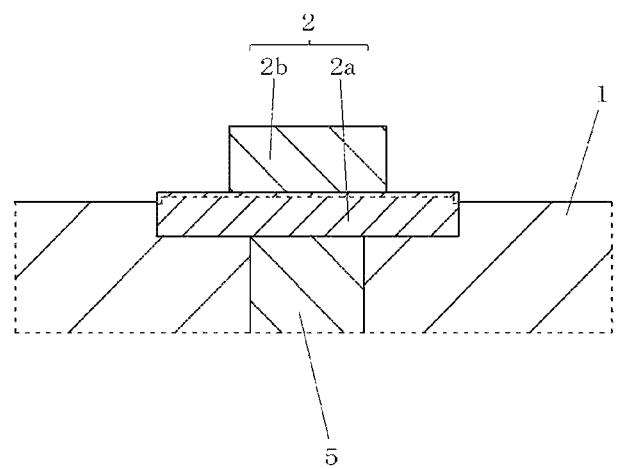
FIG. 3 is a sectional view showing a first modified example of the wiring board shown in FIG. 1.
Figure 4:
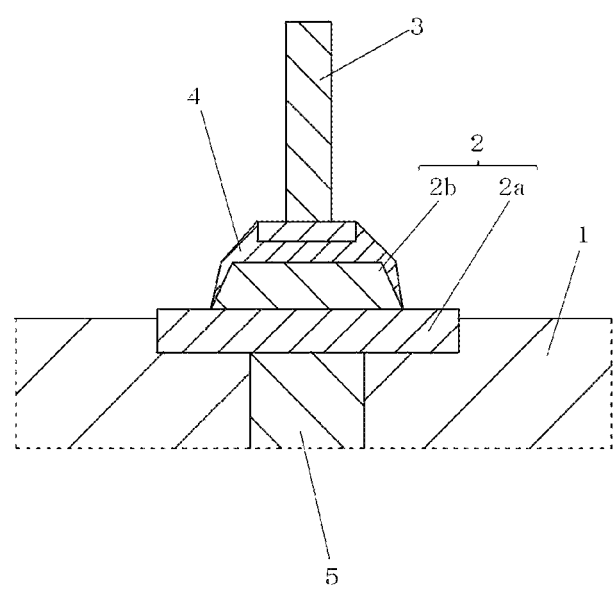
FIG. 4 is a sectional view showing a main part of a wiring board with a lead according to an embodiment of the invention.

FIG. 1(a) is a plan view showing a main part of a wiring board according to an embodiment of the invention and FIG. 1(b) is a sectional view taken along the line A-A in FIG. 1(a). Further, FIG. 2(a) is a plan view showing an example of the entirety of a wiring board whose main part is shown in FIG. 1. FIG. 2(b) is a sectional view taken along the line A-A in FIG. 2(a). Further, FIG. 3 is a sectional view showing a modified example of FIG. 1 (a first modified example). Further, FIG. 4 is a sectional view showing a main part of a wiring board with a lead constructed such that a lead terminal is joined to the wiring board of FIG. 1.

A connection pad 2 is disposed on a surface part of an insulating substrate 1 so that a wiring board is basically formed. Further, for example, like in an example of FIG. 2, a plurality of connection pads 2 are provided in an insulating substrate 1 so that a wiring board is formed that serves as a board for a sensor or a board for electronic component mounting. Further, a lead terminal 3 is joined to the connection pad 2 of the wiring board, for example, by using brazing material 4 so that a wiring board with a lead is formed.

For example, as the above-mentioned electronic component, various electronic components may be employed like: a sensor element such as a gas sensor element and an acceleration sensor element; a semiconductor integrated circuit element such as an IC and an LSI; an optical semiconductor element such as an LED (a light emitting diode), a PD (a photodiode), and a CCD (a charge coupled device); a piezoelectric element such as a surface acoustic element and a quartz resonator; a capacitive element; a resistor; and a micromachine (a so-called MEMS element) fabricated such that a minute electromechanical structure is formed on the surface of a semiconductor substrate.

For example, the insulating substrate 1 has a plate shape such as a square plate shape and constitutes a board portion in which the plurality of connection pads 2 are provided in a manner of being electrically insulated from each other. For example, the insulating substrate 1 is composed of a ceramic sintered compact such as an aluminum-oxide based sintered compact, an aluminum-nitride based sintered compact, a mullite-based sintered compact, and a glass ceramic sintered compact. The insulating substrate 1 may be formed such that a plurality of insulating layers (not shown) composed of such a ceramic sintered compact are laminated.

For example, when formed such that a plurality of insulating layers composed of an aluminum-oxide based sintered compact are laminated, the insulating substrate 1 may be fabricated by the following method. That is, first, a plurality of ceramic green sheets obtained such that raw material powder such as aluminum oxide and silicon oxide together with suitable organic binder and a suitable organic solvent are formed into a sheet shape are laminated into the form of a stack. After that, the stack is fired so that fabrication is achieved.

The connection pad 2 includes: a first portion 2a having a layered form; and a second portion 2b provided such as to protrude to the outer side (upward, in the example of FIG. 1) of the surface (an upper face, in the example of FIG. 1) of the first portion 2a in a center portion of the first portion 2a in a plan view.

The second portion 2b of the connection pad 2 is composed of platinum. Further, an exposed surface part of the first portion 2a is composed of platinum containing a ceramic component. Here, in FIG. 1(b), the upper portion above the dashed line in the first portion 2a corresponds to the above-mentioned exposed surface part of the first portion 2a. That is, the exposed surface part of the first portion 2a indicates: a surface which does not make contact with the insulating substrate 1 and the second portion 2b of the entire surface of the first portion 2a; and the inside near the surface.

According to such a wiring board, the exposed surface part of the first portion 2a of the connection pad 2 is composed of platinum containing a ceramic component and the second portion 2b is composed of platinum. Thus, the first and the second portion 2a and 2b of the connection pad 2 are, both, less prone to be oxidized even at high temperatures and hence oxidation in the connection pad 2 can be suppressed.

Further, for example, in a case where the lead terminal 3 is joined to the connection pad 2 by using the brazing material 4, a situation is suppressed that the brazing material 4 wets the connection pad and spreads (simply referred to as "spreads", in some cases hereinafter) even to the first portion 2a. Thus, the position of the peripheral portion of the connection pad 2 in a plan view becomes distant from the peripheral portion of the brazing material 4 where thermal stress generated between the connection pad 2 and the lead terminal 3 tends to be large. Accordingly, a situation is suppressed that a thermal stress is concentrated on the peripheral portion of the connection pad 2. This suppresses mechanical fracture in the connection pad 2 and the like.

Thus, a wiring board can be provided in which oxidation and mechanical fracture in the connection pad 2 caused by heat are easily suppressed and hence an excellent heat resisting property is obtained. Further, a wiring board can be provided that permits fabrication of a wiring board with a lead having an excellent heat resisting property.

In this case, the second portion 2b of the connection pad 2 serves as a main joining portion joined to the brazing material 4 so that the lead terminal 3 is joined to the connection pad 2 (the insulating substrate 1). The first portion 2a may be recognized as a suppression portion for suppressing unnecessary spreading of the brazing material 4. Thus, in the first portion 2a, at least the exposed surface part need contain the ceramic component. The depth where the ceramic component is contained (to what distance from the surface of the first portion 2a toward the inside the ceramic component is contained) is suitably set up in accordance with conditions such as the environment where the wiring board is used and the productivity.

For example, when the ceramic component is aluminum oxide or the like, it is preferable that the content percentage of the ceramic component in the portion containing the ceramic component of the first portion 2a is approximately 1 mass % or higher. This reduces the wettability of the brazing material 4 in the exposed surface part of the first portion 2a and hence suppresses unnecessary spreading of the brazing material 4. Further, in order to suppress the electric resistance in the first portion 2a at a low level, it is preferable that the content percentage of the ceramic component in the portion containing the ceramic component of the first portion 2a is as low as possible. The upper limit for the content percentage of the ceramic component is suitably set up in accordance with conditions such as the region where the ceramic component is contained within the first portion 2a, the kind of the ceramic component, and the electric resistance required in the connection pad 2.

Examples of ceramic components as that contained in the first portion 2a include aluminum oxide, silicon oxide, calcium oxide, mullite, aluminum nitride, silicon nitride, and silicon carbide. The ceramic component may be obtained by mixing plural kinds of these ceramic materials. These ceramic components are dispersed in the platinum of the first portion 2a in the form of grains of spherical shapes or the like, in the form of flakes, or in another form.

From the perspective of suppressing the spreading of the brazing material 4 as described above, it is preferable that, for example, the ceramic component contained in the first portion 2a has a spherical shape and is dispersed without inhomogeneity over the surface of the first portion 2a.

For example, the connection pad 2 may be formed in the surface part of the insulating substrate 1 as follows. That is, first, platinum powder is kneaded together an organic solvent and binder so that a metal paste is prepared. Further, powder of a ceramic component such as aluminum oxide is further added to the metal paste so that a mixed paste is prepared. Then, the metal paste is printed into a predetermined pattern on the surface of the ceramic green sheet serving as the insulating substrate 1. At the same time, the mixed paste is selectively applied onto the outer periphery portion of the exposed surface of the printed metal paste. After that, in the upper face center portion of the metal paste, a metal paste of platinum is printed in a convex manner. At last, simultaneous firing is performed so that the connection pad 2 is formed on the surface such as the upper face of the insulating substrate 1. In this case, the metal paste printed first and the mixed paste thereon serve as the first portion 2a of the connection pad 2 and the metal paste printed after that in a convex manner serves as the second portion 2b.

Here, in the above-mentioned formation method for the connection pad 2, at the time of successively printing the metal paste and the mixed paste constituting the first portion 2a, an approach that the mixed paste is printed on the entirety of the exposed surface of the metal paste is easy in working and has also a high productivity because the printing pattern of the mixed paste need not accurately be adjusted. In the case of such a formation method, as shown in FIG. 3, the portion containing the ceramic component of the first portion 2a is constituted from the surface in contact with the second portion 2b and the inside near the surface (the portion outside the dashed line), in addition to the exposed surface part. This embodiment is more advantageous from the perspective of suppression of fluctuation in the characteristics as a wiring board, the productivity, and the like. Here, FIG. 3 is a sectional view showing a first modified example of the wiring board shown in FIG. 1 described above. In FIG. 3, parts similar to those of FIG. 1 are denoted by the same reference numerals.

Further, the mixed paste and the metal paste having been printed may be pressurized and, after that, the subsequent paste printing and the like may be performed. In a case where the mixed paste or the metal paste having been printed is pressurized, the mixed paste or the metal paste is pushed from the surface into the inside of the ceramic green sheet and, at the same time, the surfaces (the upper face) can be flattened. For example, in a case where the metal paste printed first and the mixed paste thereon are pushed from the surface into the inside of the ceramic green sheet, the connection pad 2 can be formed in which at least a part in the thickness direction of the first portion 2a is buried in the surface part of the insulating substrate 1.

In a case where at least a part in the thickness direction of the connection pad 2 is buried in the surface part of the insulating substrate 1, reliability of joining between the connection pad 2 and the insulating substrate 1 is improved because of an increase in the area of mutual joining, a situation that a joining surface whose direction intersects with the stress is included, and other reasons.

When the flatness of the upper face of the connection pad 2 is improved, joining of the lead terminal 3 to the connection pad 2 becomes easier. Further, when the flatness of the upper face of the paste such as the metal paste constituting the connection pad 2 is improved, subsequent metal paste printing or the like can be more easily performed.

In the first portion 2a of the connection pad 2, in a case where the exposed surface part alone is composed of platinum containing a ceramic component, an effect of suppressing the flow of the brazing material 4 is obtained in a state where the conduction resistance in the first portion 2a is suppressed as low as possible. Thus, in this case, a larger effect is obtained in the point of ensuring more highly the electrical properties of the wiring boards such as the conduction resistance in the connection pad 2.

Here, the metal paste constituting the connection pad 2 may be not printed into a predetermined thickness at one time of printing. That is, the printing may be divided into plural times. Further, after each time of the printing, the printed metal paste may be pressurized. Specific examples of the connection pad 2 the formation method according to this embodiment are described later.

For example, the lead terminal 3 may be fabricated such that suitable metalworking such as cutting processing, elongation processing, and etching processing is performed on a wire rod of the above-mentioned metallic material so that a predetermined shape and predetermined dimensions are achieved.

The lead terminal 3 in the example of FIG. 4 is a lead pin member having a disk-shaped tip portion (a so-called nail head). The tip (the lower face, in the example of FIG. 4) of the nail head portion faces the tip (the upper face) of the second portion 2b of the connection pad 2 and is joined by using the brazing material 4. For example, the brazing material 4 is: a gold brazing material containing gold as the main component and containing silver or the like as an additive; a brazing material composed of gold; an aluminum brazing material; or the like.

Here, joining of the lead terminal 3 to the connection pad 2 may be performed not by using the brazing material 4 and may be performed by using another means such as welding.

The lead terminal 3 may be not a lead pin member like that in the present embodiment and may be a belt-shaped member (a so-called flat lead) or, alternatively, a member (not shown) having another shape like a shape curved in the middle of the length direction (a so-called J-lead). When the lead terminal 3 is a flat lead, one end portion of the lead terminal faces the connection pad 2 and is joined thereto. Then, the other end portion faces a predetermined part of an external electric circuit and is joined thereto. In this case, the lead terminal is joined such that the length direction thereof becomes in parallel to the upper face of the insulating substrate 1. Further, even in such a case, the lead terminal 3 can be joined to the connection pad 2 by using similar means to that employed in the case of a lead pin member.

It is preferable that the brazing material 4 is one having a melting point of approximately 450° C. or higher (a so-called hard soldering material). In a case where the melting point of the brazing material 4 is approximately 450° C. or higher, even in a case where the wiring board to which the lead terminal 3 has been joined is used in a high-temperature environment of approximately 400° C. to 450° C., the strength of joining of the lead terminal 3 to the connection pad 2 (the insulating substrate 1) is ensured more reliably. For example, such a high-temperature environment occurs in a case where the wiring board is used in the application of a sensor device or the like concerning an internal combustion engine described above.

Figure 5:
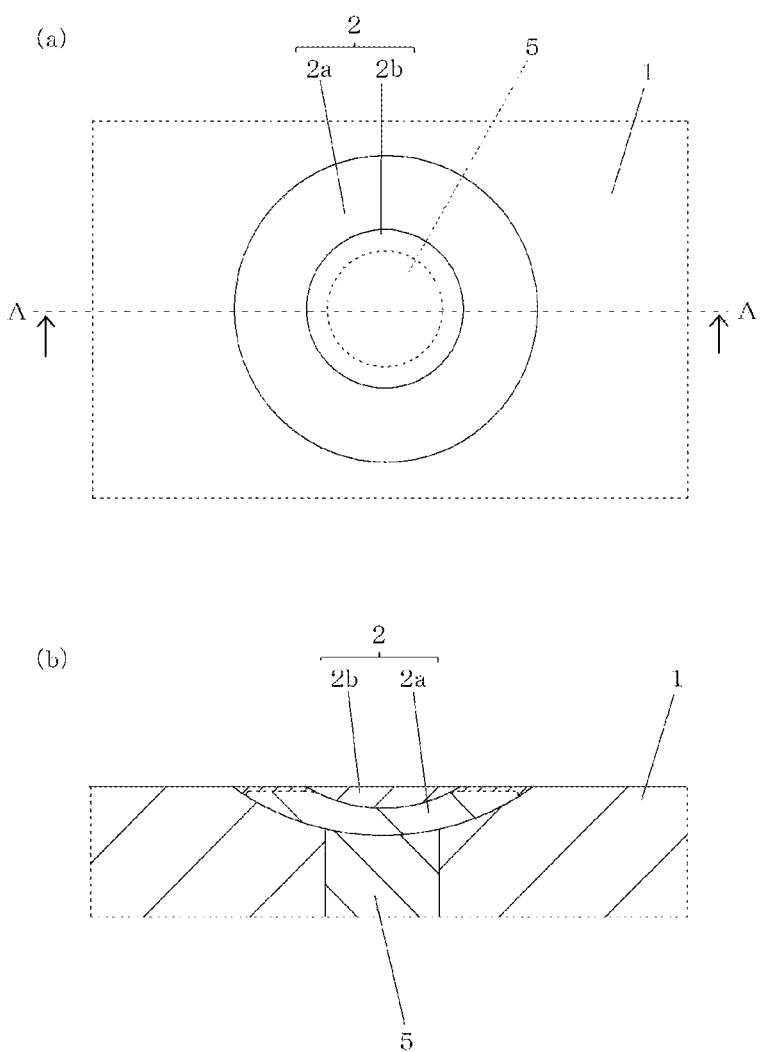
FIG. 5(a) is a sectional view showing a second modified example of the wiring board shown in FIG. 1
FIG. 5(b) is a sectional view taken along the line A-A in FIG. 5(a)

When the effect of suppressing thermal stress concentration described above is taken into consideration, it is preferable that the brazing material 4 spreads in the second portion 2b alone of the connection pad 2 like in the example shown in FIG. 5. If a part of the brazing material 4 spreads to the first portion 2a, in the portion of spreading, the peripheral portion of the brazing material 4 where thermal stress is easily concentrated would become close to the peripheral portion of the connection pad 2 (the first portion 2a). In accordance with this, thermal stress acting on the peripheral portion of the connection pad 2 would become large and hence a possibility would be caused that the effect of improving the reliability of joining of the connection pad 2 to the insulating substrate 1 is reduced. In contrast, in a case where the brazing material 4 spreads in the second portion 2b alone of the connection pad 2, the effect of suppressing thermal stress concentration is obtained more reliably.

FIG. 5(a) is a plan view showing a second modified example of the wiring board shown in FIG. 1. FIG. 5(b) is a sectional view taken along the line A-A in FIG. 5(a). In FIG. 5, parts similar to those of FIG. 1 are denoted by the same reference numerals. In the example of FIG. 5, the entirety of the connection pad 2 is buried in the surface part of the insulating substrate 1. The first portion 2a has a shape curved convexly toward the insulating substrate 1. Then, the second portion 2b is provided in the center portion of the curved upper face of the first portion 2a. That is, the second portion 2b does not have a shape protruding upwardly. Instead, the upper faces of the first portion 2a and the second portion 2b form a continuous plane.

Even in such a case, the first and the second portion 2a and 2b of the connection pad 2 are, both, less prone to be oxidized even at high temperatures and hence oxidation in the connection pad 2 can be suppressed. Further, a situation is suppressed that the brazing material 4 for brazing the lead terminal 3 spreads even to the first portion 2a. This suppresses thermal stress concentration to the peripheral portion of the connection pad 2. Accordingly, mechanical fracture in the connection pad 2 and the like is also suppressed. As a result, a wiring board and a wiring board with a lead which are excellent in the heat resisting property can easily be provided.

Further, in this case, the entirety of the connection pad 2 is buried in the surface part of the insulating substrate 1. Thus, the reliability of joining of the connection pad 2 to the insulating substrate 1 can be also improved more effectively. Further, in the connection pad 2 itself, the reliability of joining of the second portion 2b to the first portion 2a is also improved further by an increase in the area of joining between the first portion 2a and the second portion 2b and by other reasons.

The connection pad 2 of such an embodiment may be formed by successively printing mixed paste constituting the first portion 2a and metal paste constituting the second portion 2b into predetermined patterns on a ceramic green sheet; after that, pressurizing these mixed paste and metal paste so that these pastes are pushed into the ceramic green sheet; and then performing simultaneous firing.

In the insulating substrate 1, a conductor 5 extending from the connection pad 2 toward the inside is provided. The conductor 5 is a portion forming an electrically conducting path for electrically connecting the connection pad 2 to an external electric circuit. For example, the conductor 5 is provided from the surface part of the lower end of the connection pad 2 to a surface (the lower face or the like) opposite to the surface part of the insulating substrate 1 where the connection pad 2 is provided. By virtue of this, the connection pad 2 is electrically derived to an outer surface such as the lower face of the insulating substrate 1. That is, in this case, the conductor 5 is a penetration conductor penetrating through the insulating substrate 1 in the thickness direction. Here, such an electrically conducting path is not limited to a form of a penetration conductor, and may include a wiring conductor (not shown) in the form of a circuit pattern or the like provided in the inside, the lower face (the surface on the side opposite to the connection pad 2), or the like of the insulating substrate 1.

In the conductor 5 such as a penetration conductor, it is sufficient that at least the upper end thereof is in contact with the lower end of the connection pad 2. That is, the upper end may partly penetrate through the insulating substrate 1 in the thickness direction. In this case, for example, the lower end portion of the conductor 5 is connected to a wiring conductor provided in the inside of the insulating substrate 1, and then electrically derived through this wiring conductor or the like to the lower face, the side surface, or the like of the insulating substrate 1.

For example, similarly to the connection pad 2, the wiring conductors such as the conductor 5 may be composed of platinum or platinum containing a ceramic component or, alternatively, may be composed of another metallic material. For example, this metallic material is a platiniridium alloy, an iron-nickel-chrome alloy, tungsten, molybdenum, niobium, silver, palladium, or the like. Then, it is preferable that the metallic material is one permitting simultaneous firing with a ceramic green sheet serving as the insulating substrate 1.

Figure 6:
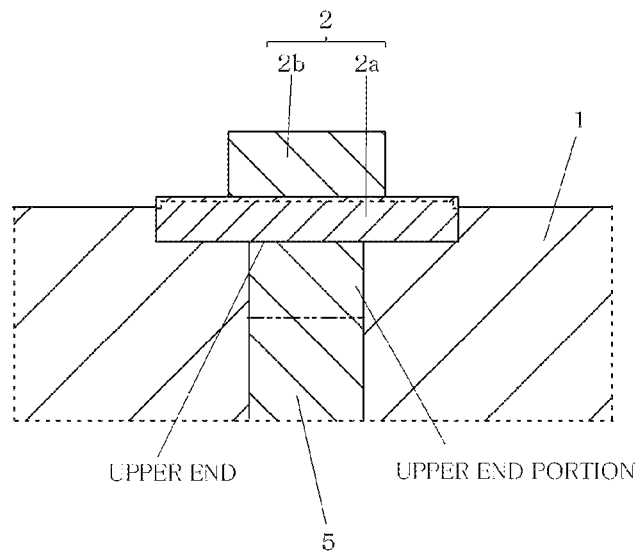
FIG. 6 is a sectional view showing another example of a penetration conductor portion of a wiring board shown in FIG. 1.

For example, in the case of a penetration conductor as shown in FIG. 6, the conductor 5 may be formed by performing perforation processing such as mechanical punching processing and laser beam machining on a ceramic green sheet serving as the insulating substrate 1 so that a through hole is provided; then filling the inside of the through hole with metal paste composed of the above-mentioned metallic material; and after that, performing simultaneous firing.

In the conductor 5, for example, in a case where at least the upper end portion including the upper end connected to the lower end of the connection pad 2 as shown in FIG. 6 is composed of a metallic material containing an iron-nickel-chrome alloy as the main component, the heat resisting property as a wiring board is improved further. Here, FIG. 6 is a sectional view showing another example of the conductor 5 portion of the wiring board shown in FIG. 1. In FIG. 6, parts similar to those of FIG. 1 are denoted by the same reference numerals. A lead terminal 3 may be joined to the wiring board of this embodiment so that a wiring board with a lead may be fabricated.

That is, in this case, even if outside air containing oxygen went into contact with the upper end portion of the conductor 5 through a gap between the platinum sintered compacts forming the connection pad 2, the oxygen component would oxidize the iron-nickel-chromium so that a passivation film of an oxide thereof would be formed. Thus, a situation would be suppressed that oxidation in the conductor 5 progresses further to the inside. This improves the heat resisting property as a wiring board and a wiring board with a lead.

The passivation film formed in the upper end portion of the conductor 5 has a thickness of about 1 nm (0.001 μm) to 15 μm. Thus, an increase in the conduction resistance of the conductor 5 caused by the presence of the passivation film can be suppressed to an extent (e.g., a ratio of increase of about 10% in comparison with the initial resistance) not causing a practical problem.

Here, in the wiring board including the above-mentioned connection pad 2, in a case where the wiring board is use at a higher temperature, for example, exceeding 500° C. (approximately 1000° C. or lower) or, alternatively, used for a longer time (e.g., 100 hours or longer) in a high-temperature environment, it is preferable that the wiring board has a higher heat resisting property. Specifically, in the case of application such as a high-temperature temperature sensor or an exhaust-air gas sensor, such a wiring board (a wiring board with a lead) having a higher heat resisting property is preferable.

Here, the upper end portion of the conductor 5 indicates a depth range which is equal to or deeper than the depth where the above-mentioned passivation film is formed from the upper end (the end face) in contact with the lower end of the connection pad 2 of the conductor 5 toward the inside of the insulating substrate 1 and which is up to about 30 μm.

In a case where the iron-nickel-chrome alloy is contained as the main component in the above-mentioned range or deeper, a situation is more effectively suppressed that oxidation progresses to the inside of the penetration conductor 5.

Further, the metallic material forming the upper end portion of the conductor 5 is a metallic material containing the above-mentioned iron-nickel-chrome alloy as the main component and having a ratio of the iron-nickel-chrome alloy of 75 mass % or higher. Examples of metallic components other than the iron-nickel-chrome alloy include titanium, aluminum, molybdenum, copper, nitrogen, silicon, carbon, manganese, phosphorus, vanadium, niobium, tantalum, tungsten, cobalt, boron, tin, calcium, ruthenium, rhenium, and rare earths.

Examples of compositions of the iron-nickel-chrome alloy include: 6 to 10 mass % iron-72 mass % or higher nickel-14 to 17 mass % chromium; 20 mass % or lower iron-58 to 63 mass % nickel-21 to 25 mass % chromium; and 51 mass % or lower iron-30 to 35 mass % nickel-19 to 23 mass % chromium.

Here, in the iron-nickel-chrome alloy serving as the main component of the metallic material forming the upper end portion of the conductor 5, when effective generation of the passivation film is regarded important, a higher chromium component is preferable. Further, it is more preferable that an aluminum component is further added to the above-mentioned composition. Further, when suppression of conduction resistance into a low value (the electrical conductivity) is regarded important, a higher iron component and a higher nickel component are preferable. Further, for example, in a case where the insulating substrate 1 is composed of an aluminum-oxide based sintered compact, with taking into consideration the easiness of formation of the conductor 5 employing simultaneous firing with the insulating substrate 1, a higher nickel component is preferable.

In the conductor 5, when the upper end portion thereof alone is to be composed of a metallic material containing an iron-nickel-chrome alloy as the main component, for example, in the case of a penetration conductor as shown in FIG. 6, the following method may be employed.

That is, a through hole is formed individually in the plurality of insulating layers serving as the insulating substrate 1. Then, among these through holes, one formed in the ceramic green sheet located in the outermost surface (the uppermost layer and the lowermost layer) is filled with the paste of iron-nickel-chrome alloy. Further, in those formed in the ceramic green sheets other than the outermost surface, the through holes are filled with metal paste composed of a metallic material such as tungsten. After that, these ceramic green sheets are laminated and then fired. As such, the conductor 5 whose upper end portion alone is composed of an iron-nickel-chrome alloy can be formed. In this case, when another metallic component is added in advance to the paste of iron-nickel-chrome alloy, the metallic component other than the iron-nickel-chrome alloy can be contained in the upper end portion of the conductor 5.

Here, the through hole to be filled with the paste of iron-nickel-chrome alloy is not limited to that formed in the ceramic green sheet in the outermost surface, and may be one formed across plural layers extending from the outermost surface to the inner side (to the lower layer side or to the upper layer side). The number of layers is adjusted suitably, for example, in accordance with the thickness of the ceramic green sheet.

Further, the following method may be employed. That is, first, the inside of the through hole, except for the upper end portion, provided in the ceramic green sheets as described above is filled with the metal paste composed of a metallic material such as tungsten. Then, the through hole up to the upper end portion is filled with the paste of iron-nickel-chrome alloy. After that, simultaneous firing is performed on these. Even in this case, a penetration conductor whose upper end portion alone is composed of an iron-nickel-chrome alloy can be formed.

Further, the entirety of the conductor 5 (not shown) may be composed of the metallic material containing an iron-nickel-chrome alloy as the main component. In this case, in the entirety of the conductor 5, a situation can be suppressed that oxidation progresses further to the inside. This further improves the oxidation resistance in the wiring board.

Further, in a case where the entirety of the conductor 5 is composed of a metallic material containing an iron-nickel-chrome alloy as the main component, for example, metal paste such as an iron-nickel-chrome alloy is merely filled once into the through hole provided in the ceramic green sheets. Thus, this configuration is preferable also from the perspective of the productivity as a wiring board. Further, since the entirety of the conductor 5 is constructed from the same material, adjustment or the like of the contraction amount at the time of firing is easier.

Here, in a case where a plurality of conductors 5 are provided in the inside of the insulating substrate 1 and then only a part of the conductors 5 are in contact with the lower ends of the connection pads 2, as described above, it is sufficient that only the part of the conductors 5 include portions composed of the metallic material containing an iron-nickel-chrome alloy as the main component. That is, in the other conductors (not shown), the entirety thereof may be composed of tungsten, molybdenum, or the like, for example, with taking into consideration the workability, the economical efficiency, or the like.

Further, the metallic material of the conductor 5 forming at least the upper end portion may further contain at least one of titanium, aluminum, molybdenum, copper, nitrogen, and silicon. The at least one of titanium, aluminum, molybdenum, copper, nitrogen, and silicon may further form an alloy with the iron-nickel-chrome alloy. In this case, densification of the passivation film and improvement in the adhesion property improve the oxidation resistance further. That is, the heat resisting property as a wiring board and a wiring board with a lead is improved further.

Figure 7:
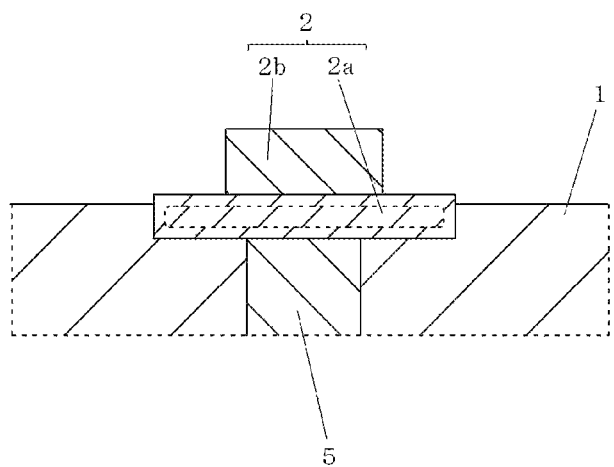
FIG. 7 is a sectional view showing a third modified example of the wiring board shown in FIG. 1.

FIG. 7 is a sectional view showing a third modified example of the wiring board shown in FIG. 1. In FIG. 7, parts similar to those of FIG. 1 are denoted by the same reference numerals. In the example shown in FIG. 7, the entirety of the surface part of the first portion 2a is composed of platinum containing a ceramic component. In this case, in addition to the effect of suppressing the spreading of the brazing material in the first portion 2a, the effect of further improving the strength and the reliability of joining of the first portion 2a to the insulating substrate 1 is obtained. A lead terminal (not shown in FIG. 7) may be joined to the wiring board of this embodiment so that a more reliable wiring board with a lead may be fabricated.

Here, in the example of FIG. 7, the outside of the portion surrounded by a dashed line of the first portion 2a is the entirety of the surface part of the first portion 2a. That is, the entirety of the surface part of the first portion 2a indicates: the entire surface of the first portion 2a; and the inside near the entire surface.

In this case, it is preferable that the ceramic component contained in the surface part of the first portion 2a has the same composition as the ceramic material forming the insulating substrate 1. By virtue of this, thermal stress or the like is reduced between the first portion 2a directly joined to the insulating substrate 1 of the connection pad 2 and the insulating substrate 1 so that the joining strength or the like between them can be improved.

For example, the first portion 2a of the connection pad 2 of such an embodiment may be formed by successively printing mixed paste and metal paste similar to the above-mentioned ones on the surface of a ceramic green sheet serving as the insulating substrate 1 in the order of the mixed paste, the metal paste, and the mixed paste and then performing firing. In this case, the printing area of the mixed paste in the first and the third printing is set larger than the printing area of the metal paste and, at the same time, each paste after the printing is pressurized. By virtue of this pressurization, the mixed pastes printed at the first time and the third time are connected to each other with the metal paste printed at the second time in between. As a result, the first portion 2a is formed in which a ceramic component is contained in the entirety of the surface part.

The improvement in the strength or the like of joining of the first portion 2a to the insulating substrate is achieved by improvement in the joining strength resulting from the bonding of the individual ceramic components, a situation that the contraction behaviors or the like of the first portion 2a and the insulating substrate 1 are easily in conformity with each other at the time of firing, and other reasons.

The content percentage of the ceramic component contained in the entirety of the first portion 2a may be set up suitably in correspondence to the characteristics such as the joining strength to the insulating substrate 1 and the conduction resistance required in the first portion 2a in the wiring board to be fabricated. In this point of joining strength, a higher content percentage of the ceramic component is advantageous and, in the point of conduction resistance, a lower content percentage of the ceramic component is advantageous.

For example, in a case where the insulating substrate 1 is composed of an aluminum-oxide based sintered compact, that the ceramic component is aluminum oxide, and that the required electrical resistivity is approximately $2 \times 10^{-7}$ $\Omega$m, it is sufficient that the content percentage of the ceramic component in the entirety of the first portion 2a is approximately 3 mass % or higher.

Figure 8:
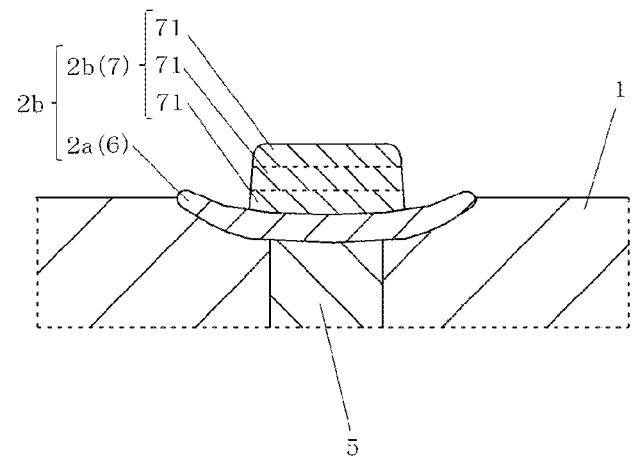
FIG. 8 is a sectional view showing a fourth modified example the wiring board shown in FIG. 1.

FIG. 8 is a sectional view showing a fourth modified example of the wiring board shown in FIG. 1. In FIG. 8, parts similar to those of FIG. 1 are denoted by the same reference numerals. In the example shown in FIG. 8, the entirety of the first portion 2a is composed of platinum containing a ceramic component. In this case, the strength and the reliability of joining of the first portion 2a to the insulating substrate 1 can be improved further. Here, even in this case, it is preferable that the ceramic component contained in the first portion 2a has the same composition as the ceramic material forming the insulating substrate 1. A lead terminal (not shown in FIG. 8) may be joined to the wiring board of this embodiment so that a more reliable wiring board with a lead may be fabricated.

The second portion 2b is laminated onto the first portion 2a whose entirety is composed of platinum containing a ceramic component so that the connection pad 2 is formed.

The example of FIG. 8 may be regarded as a configuration that the connection pad 2 includes: a first layer 6 provided in the surface part of the insulating substrate 1; and a second layer 7 provided in the center portion of the exposed surface of the first layer 6. The first layer 6 is composed of platinum containing a ceramic component and the second layer 7 is composed of platinum. Here, in this case, the first layer 6 corresponds to the first portion 2a and the second layer 7 corresponds to the second portion 2b. In other words, the connection pad 2 is formed by: the first layer 6 composed of platinum and a ceramic component; and the second layer 7 composed of platinum and provided in a convex manner in the center portion of the first layer. By virtue of this, the connection pad 2 can be easily formed in which the entirety of the first portion 2a is composed of platinum containing a ceramic component as described above.

Further, in the example of FIG. 8, the second portion (the second layer 7) of the connection pad 2 includes a plurality of metal layers 71 (three layers, in the example of FIG. 8) laminated on top of each other. Each metal layer 71 is composed of platinum. The plurality of metal layers 71 composed of platinum may be formed by a method similar to the formation method for the second portion 2b described above. That is, metal paste of platinum is successively printed on mixed paste constituting the first portion 2a (the first layer 6) and then firing is performed so that the connection pad 2 can be formed that includes the first portion 2a and the second portion 2b laminated on the first portion 2a. Even in this case, after the metal paste constituting each metal layer 71 is printed, pressurization may be performed at each time. In a case where the metal paste constituting metal layer 71 is pressurized, the upper face is flattened and hence subsequent metal paste printing can be more easily performed. Further, even when the metal paste is printed in plural times, the upper face is less prone to become convex (a so-called mountain shape). Thus, the number of times of printing and the printing thickness of the metal paste can be easily increased further. That is, this method can be advantageous means especially when the thickness of the connection pad 2 (especially the second portion 2b) is to be increased.

Further, the connection pad 2 including the second layer 7 constructed by laminating the plurality of metal layers 71 as described above is effective also when the height of the second portion 2b of convex shape is to be increased. With increasing height of the second portion 2b, the thermal stress or the like caused by the heat received, for example, at the time of joining of the lead terminal 3 to the connection pad 2 is more effectively alleviated by the second portion 2b. Further, a larger amount of the brazing material 4 may be used so that the effect of alleviation of the thermal stress can be also obtained by the brazing material. Thus, a wiring board can be obtained that is more effective in improvement in the reliability such as the reliability of connection through the lead terminal 3 to an external electric circuit. Further, a wiring board with a lead can be obtained that is advantageous in improvement of the reliability of connection to an external electric circuit. In other words, a wiring board and a wiring board with a lead can be provided that are effective also in improvement in the heat resisting property in the point of suppression of problems caused by the thermal stress.

In this case, for example, it is also possible to fabricate a wiring board and a wiring board with a lead that include a thick connection pad 2 in which the thickness of the second portion 2b composed of platinum is approximately 50 to 100 µm or larger. Even in a case where the second portion 2b is thick, the connection pad 2 having a relatively flat upper face and having a thick platinum portion can be formed, for example, when printing of the metal paste and pressurization thereto are repeated as described above.

Further, in the example of FIG. 8, the entirety of the first portion 2a is curved convex downwardly. That is, the joining surface of the connection pad 2 to the insulating substrate 1 is curved in the entirety. In such a case, for example, even a thermal stress horizontally acts on the connection pad 2, a joining interface between the connection pad 2 and the insulating substrate 1 is present even in a direction intersecting with the direction of the action. Thus, mechanical fracture such as a crack in the interface portion between the connection pad 2 and the insulating substrate 1 caused by the above-mentioned thermal stress in the horizontal direction can be more effectively suppressed.

Figure 9:
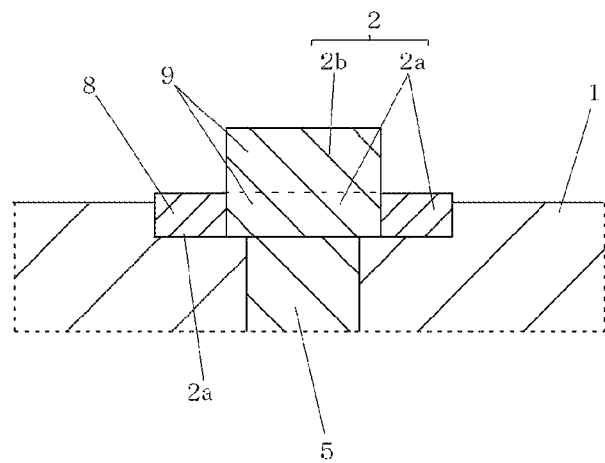
FIG. 9 is a sectional view showing a fifth modified example of the wiring board shown in FIG. 1.

FIG. 9 is a sectional view showing a fifth modified example of the wiring board shown in FIG. 1. In FIG. 9, parts similar to those of FIG. 1 are denoted by the same reference numerals. In the example shown in FIG. 9, in addition to the exposed surface part of the first portion 2a, the entirety of the peripheral portion alone contains a ceramic component. Further, the center portion of the first portion 2a is composed of platinum and does not contain a ceramic component. The center portion of the first portion 2a is, in the up and down directions, continuous to the second portion 2b on the upper side. That is, the present embodiment may be regarded as an example that the connection pad 2 is formed by: an annular outer periphery portion 8 composed of platinum containing a ceramic component; and a pillar-shaped center portion 9 located on the inner side thereof and including a portion protruding outwardly (upwardly) from the surface (the upper face) of the outer periphery portion.

In this case, the path extending from the lead terminal 3 through the center portion 9 to the penetration conductor 5 does not contain a ceramic component (and is composed of platinum). Thus, this configuration is effective in that the conduction resistance along the path is suppressed low. A lead pin (not shown in FIG. 9) may be joined to the wiring board of this embodiment so that a wiring board with a lead may be fabricated that is more advantageous in improvement in the reliability and reduction of the conduction resistance.

For example, the connection pad 2 of such an embodiment may be formed by first printing mixed paste similar to the above-mentioned one in an annular pattern onto the surface of the ceramic green sheet serving as the insulating substrate 1; after that, printing metal paste of platinum similarly to the above-mentioned one in a convex manner in the inner side of the annular pattern; and then performing firing.

The wiring board or the wiring board with a lead of the above-mentioned embodiments constitutes an electronic device when electronic components are mounted like various kinds of sensor elements such as a pressure sensor element, semiconductor elements, resistors, and capacitive elements. This electronic device is utilized in a manner of being mounted as a component on a variety of electronic equipment such as various kinds of sensors such as a pressure sensor, a computer, and a transmitter.

Figure 10:
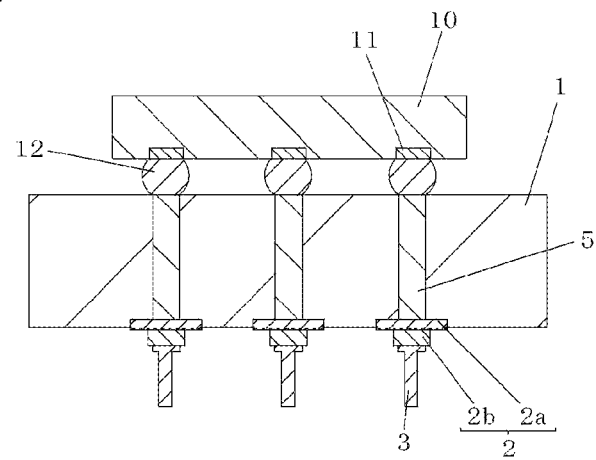
FIG. 10 is a sectional view showing an electronic device according to an embodiment of the invention.

FIG. 10 is a sectional view showing an electronic device according to an embodiment of the invention. In FIG. 10, parts similar to those of FIGS. 1 and 5 are denoted by the same reference numerals. An electronic component 10 is installed and mounted on a wiring board with a lead constructed by connecting a lead terminal 3 to a wiring board, so that an electronic device of the embodiment is formed. Here, FIG. 10 shows a situation that the wiring board and the wiring board with a lead in FIGS. 1 and 3 are inverted upside down.

For example, the mounting of the electronic component onto the wiring board or the wiring board with a lead is achieved by mounting an electronic component on a main surface (FIG. 10 upper face) opposite to the main surface of the insulating substrate where the connection pad 2 is provided; and then electrically connecting electrodes 11 of the electronic component 10 and the end portions of the penetration conductors 5 through electrically conductive connection material 12 such as brazing material.

Here, the electronic device of the embodiment need not indispensably include the lead terminals 3. That is, the electronic device (not shown) may be constructed by: a wiring board of any one of the above-mentioned embodiments; and an electronic component mounted on the insulating substrate 1 of the wiring board and electrically connected to the connection pads 2. In this case, for example, the connection pad 2 is electrically and mechanically connected to an external circuit through brazing material such as gold. By virtue of this, the electronic component and an external electric circuit are electrically connected to each other through the electrically conducting path including the connection pad 2.

Further, the wiring board or the like in each of the above-mentioned embodiments has been described for an example that the second portion 2b is arranged in the center portion on the first portion 2a. However, it is sufficient that the outer periphery of the second portion 2b is located on the inner side of the outer periphery of the first portion 2a. For example, because of the productivity or the like, in the connection pad (not shown), the second portion may be arranged in a deviated manner toward a part of the peripheral portion on the first portion. In other words, for example, when the first portion 2a and the second portion 2b both have circular shapes, these portions may be arranged in a non-concentric manner to each other in a plan view. In yet other words, the distance between the outer periphery of the second portion 2b and the outer periphery of the first portion 2a may be not constant. In whichever case, the position of the peripheral portion of the brazing material 4 deviates from the position of the peripheral portion of the connection pad 2 and hence mechanical fracture in the connection pad 2 caused by concentration of the thermal stress is suppressed.

However, for example, as in the example of FIG. 1 or the like, when the second portion 2b is located in the center portion on the first portion 2a (for example, when they are located in a concentric manner to each other), the effect of reducing the concentration of the thermal stress to the same extent along the entire circumference of the connection pad 2 is easily obtained. Thus, a possibility is reduced that a relatively large thermal stress occurs in a part of the peripheral portion of the connection pad 2. Accordingly, mechanical fracture in the connection pad 2 is more effectively suppressed.

Here, the wiring board and the wiring board with a lead can also serve as electronic devices such as various kinds of sensors without an electronic component being mounted. For example, when the lead terminal 3 or the like is electrically connected to an external circuit for electrical property measurement such as conduction resistance measurement, a change in the conduction resistance (e.g., the resistivity) of the lead terminal 3 caused by a change in the external environment is sensed. By virtue of this, the change in the external environment can be sensed. For example, such external environments include the abundance of electrically conductive suspended substance such as soot (carbon particles) in an environment where the wiring board or the wiring board with a lead is located.

REFERENCE SIGNS LIST

1: Insulating substrate
2: Connection pad
2*a*: First portion
2*b*: Second portion
3: Lead terminal
4: Brazing material
5: Conductor
6: First layer
7: Second layer
71: Metal layer
8: Outer periphery portion
9: Center portion
10: Electronic component
11: Electrode
12: Electrically conductive connection material

The invention claimed is:

1. A wiring board, comprising:
   an insulating substrate composed of a ceramic sintered compact; and
   a connection pad disposed on a surface part of the insulating substrate,
   the connection pad including a first portion disposed on the surface part of the insulating substrate and a second portion disposed on the first portion and an outer periphery of the second portion being located on an inner side of an outer periphery of the first portion, and
   the second portion of the connection pad being composed of platinum, and at least an exposed surface part of the first portion of the connection pad being composed of platinum containing a ceramic component.

2. The wiring board according to claim 1, wherein an entirety of the surface part of the first portion is composed of the platinum containing the ceramic component.

3. The wiring board according to claim 1, wherein an entirety of the first portion is composed of the platinum containing the ceramic component.

4. The wiring board according to claim 1, wherein at least a part in a thickness direction of the first portion is buried in the insulating substrate.

5. The wiring board according to claim 1, wherein
   an entirety of the first portion is composed of the platinum containing the ceramic component, and
   the second portion is located in a center portion of the first portion.

6. The wiring board according to claim 5, wherein the second portion includes a plurality of metal layers laminated on top of each other.

7. The wiring board according to claim 1, wherein
   at least a part of the second portion protrudes upwardly from the first portion.

8. The wiring board according to claim 1, further comprising a conductor provided from a lower end of the connection pad toward an inside of the insulating substrate, wherein
   at least an upper end portion of the conductor which is connected to the lower end of the connection pad is composed of a metallic material containing an iron-nickel-chrome alloy as a main component.

9. The wiring board according to claim 8, wherein an entirety of the conductor is composed of the metallic material containing the iron-nickel-chrome alloy as a main component.

10. The wiring board according to claim 9, wherein the metallic material further contains at least one of titanium, aluminum, molybdenum, copper, nitrogen, and silicon.

11. A wiring board with a lead terminal, comprising:
    the wiring board according to claim 1; and
    a lead terminal joined to the connection pad of the wiring board.

12. The wiring board with a lead terminal according to claim 11, wherein the lead terminal is joined to the connection pad by using a hard soldering material.

13. The wiring board with a lead terminal according to claim 12, wherein the hard soldering material spreads over the second portion alone in the connection pad.

14. The wiring board with a lead terminal according to claim 12, wherein the hard soldering material is composed of gold.

15. An electronic device, comprising:
    the wiring board according to claim 1; and
    an electronic component mounted on the insulating substrate and electrically connected to the connection pad.

* * * * *